(12) United States Patent
Svechtarov

(10) Patent No.: US 7,994,854 B2
(45) Date of Patent: Aug. 9, 2011

(54) CIRCUIT WITH A POWER AMPLIFIER AND AMPLIFICATION METHOD

(75) Inventor: Jordan Konstantinov Svechtarov, Wijchen (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 12/864,097

(22) PCT Filed: Jan. 27, 2009

(86) PCT No.: PCT/IB2009/050327
§ 371 (c)(1),
(2), (4) Date: Jul. 22, 2010

(87) PCT Pub. No.: WO2009/095855
PCT Pub. Date: Aug. 6, 2009

(65) Prior Publication Data
US 2010/0295610 A1    Nov. 25, 2010

(30) Foreign Application Priority Data

Jan. 29, 2008 (EP) ..................................... 08101047
Jan. 27, 2009 (WO) ................... PCT/IB2009/050327

(51) Int. Cl.
*H03F 3/68* (2006.01)
(52) U.S. Cl. .................................... 330/124 R; 330/295
(58) Field of Classification Search .............. 330/124 R, 330/295, 84, 126
See application file for complete search history.

(56) References Cited

U.S. PATENT DOCUMENTS

| 4,811,422 A * | 3/1989 | Kahn ........................... 455/114.1 |
| 6,069,525 A * | 5/2000 | Sevic et al. ...................... 330/51 |
| 6,806,768 B2 * | 10/2004 | Klaren et al. ............. 330/124 R |
| 7,236,753 B2 | 6/2007 | Zipper |
| 7,256,649 B2 * | 8/2007 | Ksienski et al. ........... 330/124 R |
| 7,295,066 B2 | 11/2007 | Saed |
| 7,498,878 B2 * | 3/2009 | Lim ........................... 330/124 R |
| 7,595,688 B2 * | 9/2009 | Gandhi et al. ............. 330/124 R |
| 2006/0114060 A1 | 6/2006 | Hellberg et al. |
| 2006/0152279 A1 * | 7/2006 | Kijima ....................... 330/124 R |
| 2008/0019459 A1 | 1/2008 | Chen et al. |

FOREIGN PATENT DOCUMENTS

| EP | 1 583 228 A2 | 10/2005 |
| WO | 01/91282 A2 | 11/2001 |
| WO | 03/047093 A1 | 6/2003 |

(Continued)

OTHER PUBLICATIONS

Chireix, H.; "High Power Outphasing Modulation," Proc. of the Institute of Radio Engineers, vol. 23, No. 11; 23 pages (1935).

(Continued)

*Primary Examiner* — Henry K Choe

(57) ABSTRACT

In a power amplification circuit an output signal is generated by combining the power of a first and second signal that have been amplified separately. An input signal is received that indicates a desired amplitude and phase of the output signal. A controllable phase shift circuit adapts the phase of first and second signals dependent on the desired amplitude, so that, when the signals with the adapted phases are combined, the resulting output signal will have an envelope with the desired amplitude. A time dependent common mode phase shift is applied to both the first and second signal. A control circuit selects the time dependent common mode phase shift as a function of the desired amplitude of the output signal, to compensate for envelope amplitude dependence of a common phase shift introduced by the amplification.

11 Claims, 3 Drawing Sheets

FOREIGN PATENT DOCUMENTS

WO  2006/064466 A2  6/2006

OTHER PUBLICATIONS

Cox, D. C. "Linear Amplification with Nonlinear Components," IEEE Trans. on Communications, pp. 1942-1945 (Dec. 1974).

Raab, Frederick H. "Efficiency of Outphasing RF-Power Amplifier Systems," IEEE Transl. on Comms., vol. COM-33, No. 10, pp. 1094-1099 (Oct. 1985).

Ampem-Darko, S. O., et al. "A Novel Technique for Gain/Phase Error Cancellation in LINC Transmitters," IEEE Vehicular Techn. Conf., VTC 1999, vol. 4, pp. 2034-2038 (Sep. 1999).

Shi, B., et al. "A LINC Transmitter Using a New Signal Component Separator Architecture," Proc. 51$^{st}$ IEEE Vehicular Techn. Conf, vol. 3, pp. 1909-1913 (May 2000).

Liu, Taijun, et al. "Behavior Modeling Procedure of Wideband RF Transmitters Exhibiting Memory Effects"; 2005 IEEE MTT-S Int'l. Microwave Symp., pp. 1983-1986 (Jun. 12, 2005).

Hakala, Ilkka, et al. "A 2.14-GHz Chireix Outphasing Transmitter," IEEE Trans. on Microwave Theory and Techniques, vol. 53, No. 6, pp. 2129-2138 (Jun. 2005).

Chen, Yuan-Jyue, et al. "Multilevel LINC System Design for Wireless Transmitters," 2007 Symp. on VLSI Design, Automation and Test, 4 pgs (Apr. 1, 2007).

Helaoui, M., et al. "On the Outphasing Power Amplifier Nonlinearity Analysis and Correction Using Digitial Predistortion Technique," 2008 IEEE Radio and Wireless Symp., pp. 751-754 (Jan. 22, 2008).

International Search Report and Written Opinion for Int'l. Patent Appln. No. PCT/IB2009/050327.

* cited by examiner

CIRCUIT WITH A POWER AMPLIFIER AND AMPLIFICATION METHOD

FIELD OF THE INVENTION

The invention relates to a circuit with a power amplifier and to a method of amplification.

BACKGROUND OF THE INVENTION

WO 03/47093 describes a Chireix power amplifier. Chireix power amplifiers address the problem of non-linearity of amplification of radio frequency signals to high power levels. The basic principle is that amplitude variations of an output signal are realized by controlling the relative phase of component signals that are subsequently combined to form the output signal. This makes it possible to use component signals with constant amplitude that can be amplified to the desired power level by non-linear amplification, without affecting the linearity of the amplitude variations. In more advanced Chireix amplifiers, the amplitude of the component signals is adapted to the desired output amplitude when the desired output amplitude is small. This serves to prevent useless power dissipation associated with the realization of a low amplitude output signal from component signals that nearly cancel each other.

Unfortunately, practical Chireix power amplifiers still suffer from non-linearity problems, which may give rise to parasitic or unintended modulation. For example, when QAM modulation is used (combined amplitude and phase modulation) the modulated data may be found to be damaged due to spurious modulation.

SUMMARY OF THE INVENTION

Among others, it is an object to realize a circuit with a power amplifier, wherein effects of non-linearity that affect modulation are reduced. The invention is defined by the independent claims. Dependent claims describe advantageous embodiments.

A device according to claim 1 is provided. Herein a time dependent common mode phase shift applied to first and second signal that are later combined after the amplifier circuits to form a power output signal. The common mode phase shift is selected as a function of desired output amplitude indicated by an input signal. Preferably a predetermined function defines values of the common mode phase shift compensate an output signal amplitude dependence of phase shifts introduced by the amplifier circuits.

In an embodiment the common mode phase shift may be applied before the first and second signals are split by a dedicated common mode phase shifter. Alternatively, phase shifters that also apply differential phase shifts to the fist and second signal may be controlled partly independently to apply the amplitude dependent common mode shift.

In an embodiment a controllable preamplifier circuit coupled in front of the first and second amplifier circuit is used. The gain of the controllable preamplifier circuit is controlled dependent on the desired amplitude indicated at the input. For example a constant gain may be used below a threshold amplitude and an adapted gain may be used above the threshold to keep the first and second signals at or below a selected maximum amplitude. In this embodiment the controlled amplitude dependent common mode phase shift may be set to make the time dependent common mode phase shift compensate a phase shift resulting, among others, from control of the gain of the controllable preamplifier circuit.

BRIEF DESCRIPTION OF THE DRAWING

These and other objects and advantageous aspects will become apparent from the following description of embodiments, using the following figures:

FIG. 1 shows a circuit with a signal generator 10, an envelope detector 11, a controller 12, a common mode phase shifter 14, an amplifier circuit 16 and a combiner circuit 18. Amplifier circuit 16 comprises a splitter 160, first and second differential phase shifters 162a,b, first and second pre-amplifiers 164a,b and first and second final amplifiers 166a,b. Common mode phase shifter 14 is coupled between an output of signal generator 10 and an input of splitter 160. A first output of splitter 160 is coupled to a first input of combiner circuit 18 via first differential phase shifter 162a, first pre-amplifier 164a and first final amplifier 166a successively. A second output of splitter 160 is coupled to a second input of combiner circuit 18 via second differential phase shifter 162b, second pre-amplifier 164b and second final amplifier 166b successively. An output of combiner circuit 18 is coupled to an output of the overall circuit, which may be an antenna for example (not shown). Envelope detector 11 has an input coupled to the output of signal generator 10 and an output coupled to controller 12. Controller 12 has outputs coupled to control inputs of common mode phase shifter 14, first and second differential phase shifters 162a,b, and first and second pre-amplifiers 164a,b.

Figure 1:
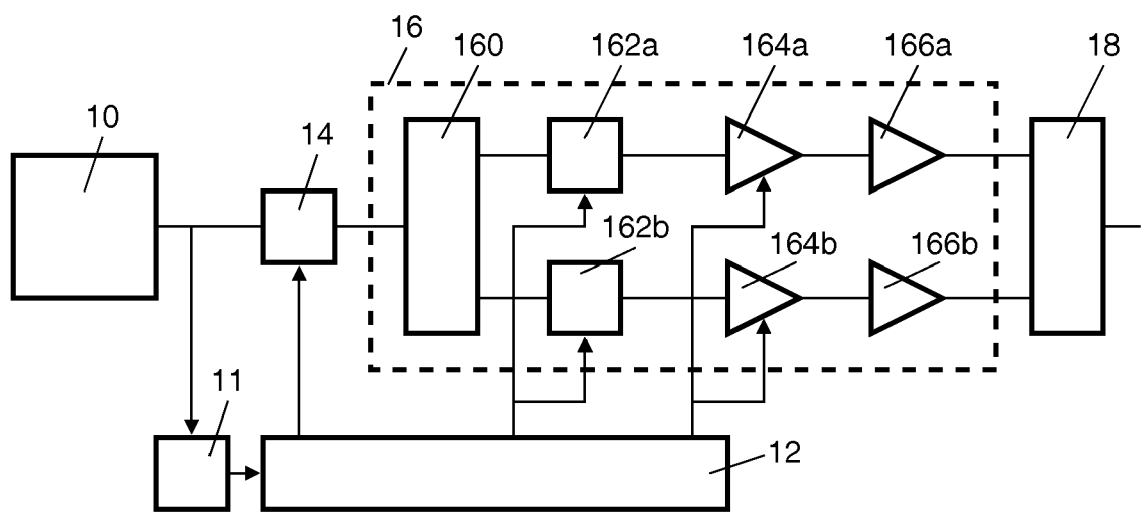
FIG. 1 shows a circuit with a power amplifier.

It should be appreciated that the circuit may additionally be configured to perform frequency conversion between base-band frequencies, intermediate frequencies and/or output frequencies at any stage before first and second final amplifiers 166a,b. For example, splitter 160 may include a frequency conversion circuit for conversion from base-band or intermediate frequency to the output frequency, or first and second pre-amplifiers 164a,b may contain such frequency conversion circuits. As another example, splitter 160 may include a frequency conversion circuit for conversion from base-band or first intermediate frequency to a second intermediate frequency and first and second pre-amplifiers 164a,b may contain a further frequency conversion circuit for conversion from the second intermediate frequency to the output frequency. In the following, unless otherwise indicated, any processing of signals will be described with the tacit understanding that such processing may comprise frequency conversion.

Furthermore it should be appreciated that part or all of the circuit before first and second final amplifiers 166a,b may be digital signal processing circuits, the signals being represented digitally. In this case any of the circuit components may contain a digital to analog converter, used to produce the output signal of the circuit component as an analog signal.

In operation signal generator 10 provides information that has to be transmitted in the form of modulation of an output signal. Any one or more of various modulation techniques may be used, such as QAM (quadrature amplitude modulation) CDMA (code division multiple access) etc. QAM, for example, involves transitioning between different points in a constellation of amplitude-phase combinations of a carrier signal, so that the information is encoded in both the amplitude and phase of the output signal. Signal generator 10 uses the information that has to be transmitted to generate a signal at its output that represents a desired amplitude and phase of the output signal (as used herein the term "signal" covers signals that may have multiple components, such as in-phase and quadrature (I/Q) components). Common mode phase shifter 14 shifts the phase represented by this signal in a controllable way and the phase shifted signal is split by splitter 160. The split signals are phase shifted by first and second differential phase shifters 162*a,b*, and amplified first and second pre-amplifiers 164*a,b* and first and second final amplifiers 166*a,b*. In an embodiment, amplitude information may be removed at least when the signal amplitude is high, i.e. the envelope amplitude at the output of first and second pre-amplifiers 164*a,b* may be made independent of the amplitude of the signal from signal generator 10. This may be done for example by adapting the gain of first and second pre-amplifiers 164*a,b* inversely as a function of the envelope amplitude of the input signal, but instead a limiter may be included in splitter 160 or any other component.

The phase shifts by first and second differential phase shifters 162*a,b* are mutually opposite, that is, the sum of these phase shifts is zero. The resulting phase shifted and amplified split signals are combined by combiner circuit 18 and the split, phase shifted, amplified and combined signals are output by combiner circuit 18. The power of the output signal is a combination of signal power originating from first and second final amplifiers 166*a,b*. Combiner circuit 18 preferably is a non-dissipative, linear circuit. In an embodiment combiner circuit 18 comprises a transmission line, or a set of transmission lines coupled between the outputs of first and second final amplifiers 166*a,b*, the transmission line or the set of transmission lines having a length of a half wavelength of the output signal plus any integer number wavelengths, from which the output signal may be tapped. Such combiner circuits are known per se, but many other known combiner circuits may be used.

Envelope detector 11 detects the desired envelope amplitude of the output signal that is indicated by the signal from signal generator 10. Controller 12 controls the phase shifts applied by common mode phase shifter 14 and first and second differential phase shifters 162*a,b* dependent on the detected amplitude of the signal from signal generator 10. Controller 12 controls the amplification applied by first and second pre-amplifiers 164*a,b* dependent on the desired envelope amplitude detected using the signal from signal generator 10.

If it was justified to assume that combiner circuit 18 would output the same sum of the split, phase shifted and amplified signals at all power levels, or if spurious phase changes in the output signal would be acceptable, the phase shift of common mode phase shifter 14 could be set to zero or a constant value, i.e. common mode phase shifter 14 could be omitted. In this case controller 12 could set the cosine of the phase shift of first and second differential phase shifters 162*a,b* proportional to the detect amplitude of the signal from signal generator 10. Additionally, controller 12 may set the gain of first and second pre-amplifiers 164*a,b* in proportion to the detected amplitude of the signal from signal generator 10, for example when the desired output power lies in a range where first and second final amplifiers 166*a,b* operate linearly. In this case the phase shift of first and second differential phase shifters 162*a,b* may be set to zero or reduced in correspondence with the adjusted gain.

Figure 2A:
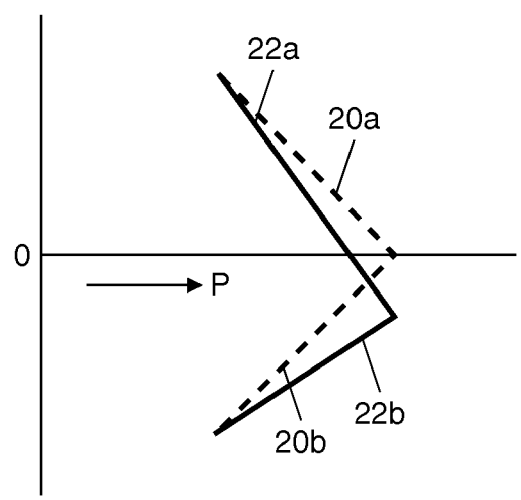
FIG. 2a-c show graphs of phase shift versus power.

FIG. 2*a* schematically shows phase shifts at the inputs and outputs of first and second final amplifiers 166*a,b* as a function of power level at the output of combiner circuit 18. However, it has been found that the power level may affect the way in which the split signals are combined. Dashed lines 20*a,b* show an example of mutually opposite phase shifts at the inputs of first and second differential phase shifters 162*a,b*, converging to zero. Lines 22*a,b* show phase shifts of the amplified signals fed to the output. As can be seen the output phase shifts 22*a,b* do not converge to zero at high power. Among others, this may be a result of the non-linear behavior of the gate-source and drain source capacitances (or base-emitter and collector-emitter capacitances) of the output transistors of first and second final amplifier 166*a,b*. These capacitances may vary due to the fact that the output devices of first and second final amplifiers 166*a,b* interact with signals from the other final amplifier through combiner circuit 18. If the input amplitude of first and second final amplifiers 166*a,b* varies, it may also be due to the fact that the phase shift depends non-linearly on the input amplitude for high power levels.

Figure 2B:
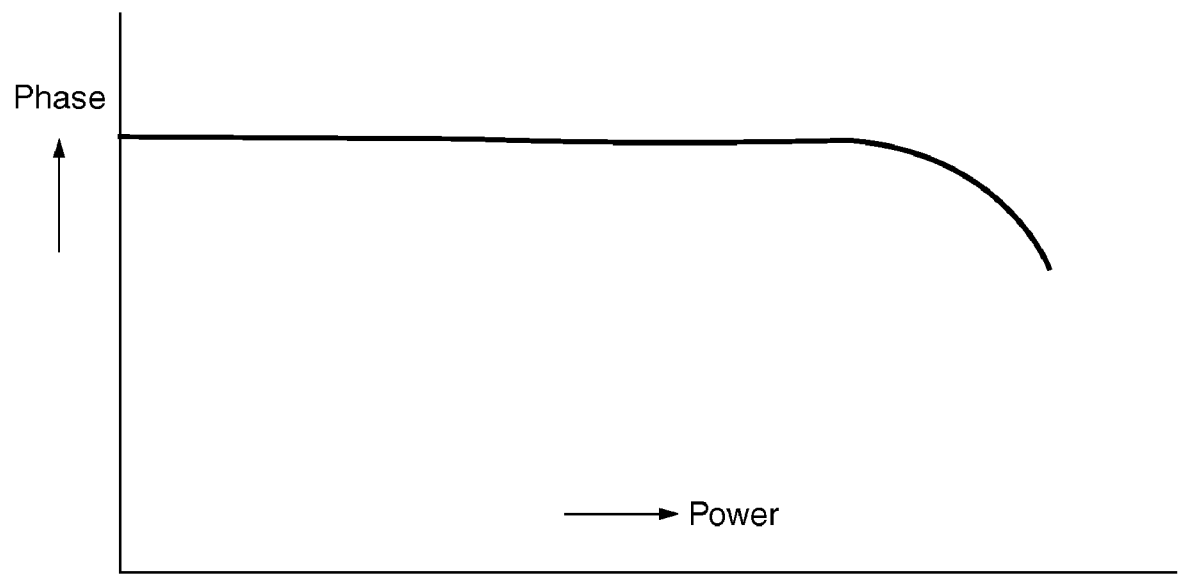

FIG. 2*b* shows an example of the phase shift due to one of first and second final amplifiers 166*a,b* as a function of output power level. The example is meant to show a trend of phase shift versus power and not a quantitative relation. As such, the graph may be taken as an example of the effect of interaction and/or input power level dependence. As can be seen, the phase shift changes at high power level. This changes occurs in the same direction in both first and second final amplifiers 166*a,b*, which has the result that output phase shifts 22*a,b* do not converge to zero at high power when the input phase shifts are mutually opposite.

Figure 2C:
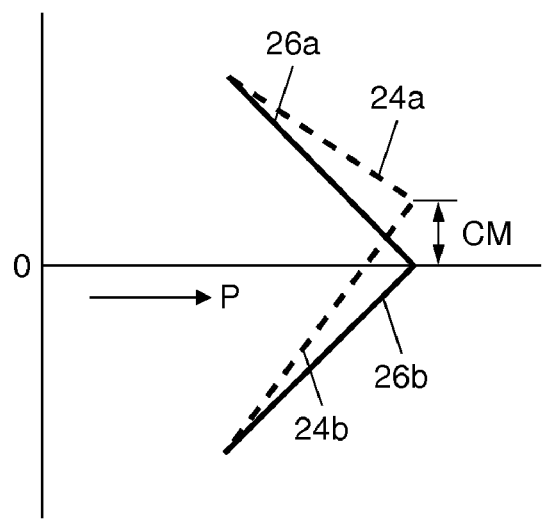

FIG. 2*c* schematically shows first lines 24*a,b* representing phase shifts at the inputs of first and second final amplifiers 166*a,b*, as controlled by controller 12. As can be seen these input phase shifts do not lie symmetrically around zero phase shift. An envelope amplitude dependent common mode phase shift CM is introduced by common mode phase shifter 14. This common mode phase shift CM is controlled by controller 12 and has a size that compensates for the asymmetric phase shift produced by first and second final amplifiers 166*a,b*. Second lines 26*a,b* represent phase shifts at the outputs of first and second final amplifiers 166*a,b*. As can be seen, the common mode phase shift CM has the effect that the output phase shifts from the different final amplifiers 166*a,b* lie symmetrically relative to zero phase.

Figure 3:
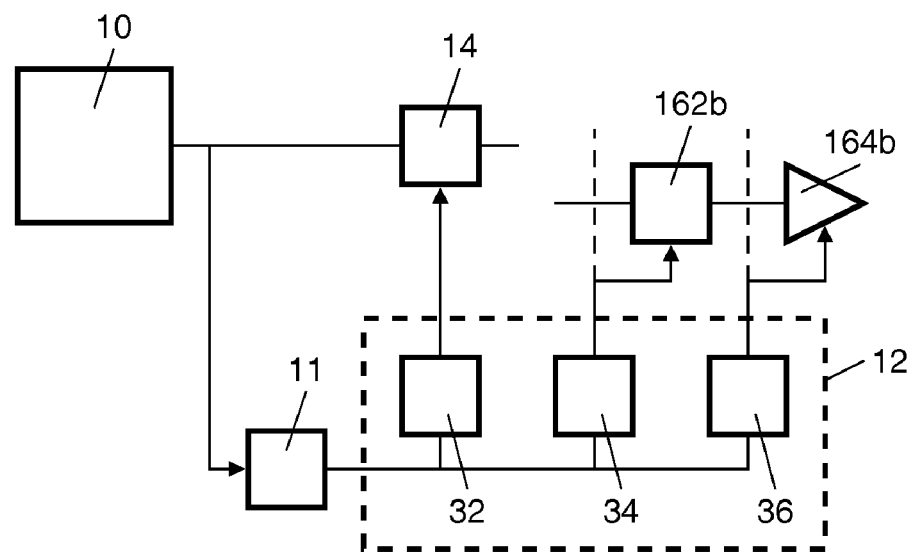
FIG. 3 shows a controller.

FIG. 3 shows an embodiment of controller 12, comprising a first, second and third control circuit 32, 34, 36. Amplifier circuit 16 is shown partly to illustrate connections to first, second and third control circuit 32, 34, 36. The output of envelope detector 11 is coupled to inputs of first, second and third control circuit 32, 34, 36. First, second and third control circuit 32, 34, 36 have outputs coupled to control inputs of common mode phase shifter 14, the differential phase shifters (one shown) and the pre-amplifiers (one shown) respectively.

In operation, envelope detector 11 detects the desired amplitude of the output signal that is indicated by the signal from signal generator 10 (i.e. the amplitude of its envelope). Envelope detector 11 supplies information about the detected amplitude to first, second and third control circuit 32, 34, 36. First, second and third control circuit 32, 34, 36 may be look-up table circuits for example, configured to store, for each of a plurality of amplitude values, control information to control a common mode phase shift, a differential phase shift and a gain for that amplitude value. In response to the information about the amplitude, first, second and third control circuit 32, 34, 36 output the corresponding control information to common mode phase shifter 14, the differential phase shifters (one shown) and the pre-amplifiers (one shown) respectively. The content of the look-up tables is selected dependent on the properties of final amplifiers 166*a,b*. The common mode phase shift selected by first control circuit 32 produces an amplitude dependent phase shift corresponding to the one shown in FIG. 2b.

As noted, the signal from signal generator 10 may be an output frequency signal or a base-band signal or intermediate frequency signal subject to subsequent frequency conversion. When the signal from signal generator 10 is a base-band signal, it may be represented by I/Q component signals (in-phase and quadrature signals) of a phase vector, whose amplitude and phase correspond to the desired amplitude and phase of the output signal at the output frequency. In this case, the envelope amplitude as a function of time may be determined simply by determining the amplitude of the phase vector as a function of time. When the signal from signal generator 10 is an output frequency signal or an intermediate frequency signal, the envelope amplitude as a function of time may be determined for example by detecting peak amplitude during at lease one period of the signal, by mixing down or by synchronous detection of the amplitude etc. The signal from signal generator 10 may be a digital signal or an analog signal. Accordingly, common mode phase shifter 14 and envelope detector 11 may be digital or analog signal processing circuits and/or they may include a digital to analog converter for producing an analog output signal.

Figure 4:
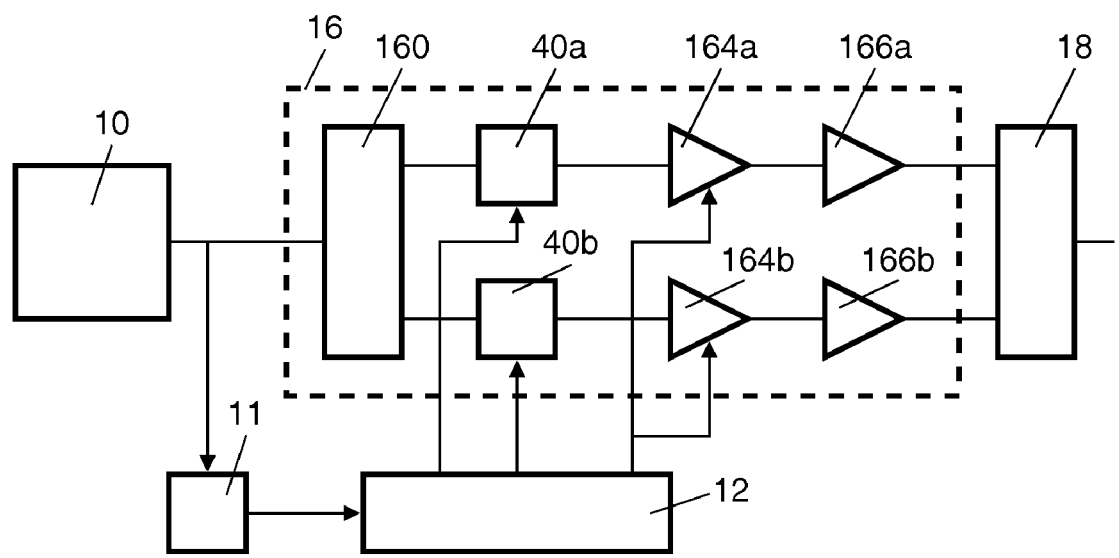
FIG. 4 shows a circuit with a power amplifier.

FIG. 4 shows an embodiment of the circuit wherein the differential phase shifters and common mode phase shifter have been replaced by independently controllable phase shifters 40a,b and independent control outputs from controller 12 to independently controllable phase shifters 40a,b. In this embodiment controller 12 is configured to apply phase control signals to phase shifters 40a,b that include the mutually opposite differential phase shifts as well as the common mode phase shift.

As another alternative, the function of common mode phase shifter 14 of FIG. 1 may be replaced by a first and second common mode shifter (not shown), coupled anywhere between splitter 160 and first and second final amplifier 166a,b respectively. In this embodiment, controller 12 controls these first and second common mode phase shifters in common instead of controlling common mode phase shifter 14.

The envelope amplitude of the signals at the outputs of first and second pre-amplifiers 164a,b may be made independent of the input signal from signal generator 10. In this case, the relation between the amplitude of the input signal from signal generator 10 and the output signal from the output of combiner circuit 18 may be realized entirely by selection of the phase shift applied by first and second differential phase shifters 162a,b. However, in an embodiment part of the amplitude dependence is retained. Thus, for example controller 12 may control first and second pre-amplifiers 164a,b to provide a constant gain when the input envelope amplitude is below a threshold value and a variable gain when the input envelope amplitude is above the threshold value.

Controller 12 may be configured to change the gain of first and second pre-amplifiers 164a,b gradually with increasing envelope amplitude above the threshold. The gradual change may be selected so that the output envelope amplitude at first and second pre-amplifiers 164a,b converges to a predetermined maximum level for high input envelope amplitudes. Alternatively, gradual decrease may be selected so that the output envelope amplitude at first and second final amplifiers 166a,b converges to a predetermined maximum level. This maximizes efficiency, and may be applied even if no common mode phase shift is applied to reduce unintended modulation. As a result of interaction through combiner circuit 18, this output envelope may also depend on the phase difference between the input signals of first and second final amplifiers 166a,b. Preferably the gain of first and second pre-amplifiers 164a,b is also adapted to compensate for this dependence, by changing the relative gains when differential phase changes are applied, even if the output signals are at the selected maximum level, according to a predetermined relation between input envelope amplitude and gain set to keep the output envelope amplitude at first and second final amplifiers 166a both at the selected maximum level. Correspondingly, controller 12 may be configured to adapt the phase shift applied by first and second differential phase shifters 162a,b when the input envelope amplitude is above the threshold, in order to provide for the required output amplitude at the output of combiner circuit 18.

In this case, the envelope amplitude at the output of first and second final amplifiers 166a,b or, dependent on the embodiment, the envelope amplitude at the output of first and second pre-amplifiers 164a,b, varies in proportion to the envelope amplitude of the input signal while that amplitude is below the threshold and saturates at the maximum level for higher input amplitudes. In an embodiment the maximum level is kept for input amplitudes above a further threshold value, above the threshold value above which the gain begins to vary. The differential phase shift from first and second differential phase shifters 162a,b is at a constant value of for example zero or ninety degrees while the input amplitude is below the threshold and changes with increasing amplitude above the threshold. As mentioned, the gains for the different amplifiers may vary differently in order to keep the output amplitudes at first and second final amplifiers 166a,b equal. Thus power efficiency may be made optimal for low amplitudes and on the other hand non-linearity of first and second final amplifiers 166a,b above the selected maximum level does not affect the linearity of the overall response.

In this embodiment, the gain adaptation of first and second pre-amplifiers 164a,b may result in a common node phase shift, which could result in spurious phase modulation of the output signal from combiner circuit 18. Controller 12 compensates for this common mode phase shift by controlling common mode phase shifter 14 to adapt at least part of the common mode phase shift in an opposite direction compared to the phase shift that results from the gain adaptation of first and second pre-amplifiers 164a,b. Preferably controller 12 sets the size of at least part of the common mode phase shift of common mode phase shifter 14 equal to the phase shift due to the adaptation of the gain of first and second pre-amplifiers 164a,b. In addition of course, controller 12 may control common mode phase shifter 14 to provide a common mode phase shift for compensating other common mode phase shift effects that depend on the signal envelope amplitude.

Although an example of a sequence of components has been shown, it should be appreciated that functionally similar results may be obtained using different sequences of components. For example first and second pre-amplifiers 164a,b may be placed in front of differential phase shifters 162a,b, or they may be replaced by a single pre-amplifier in front of splitter 160.

Although embodiments have been shown wherein a separate envelope detector 11 is used, it should be appreciated that envelope detector 11 may be part of signal generator 10. In an embodiment signal generator 10 may be configured use transmission data directly to derive a signal that represents the desired output signal amplitude (i.e. not through a base-band signal). In this embodiment this signal that represents the desired output signal amplitude directly may be used directly, without using an envelope detector 11. Also, if signal generator 10 produces a base-band signal represented by a phase signal and an amplitude signal, instead of I/Q components, the amplitude signal may be used directly.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A circuit with a power amplifier, the circuit comprising:
   a first amplifier circuit and a second amplifier circuit for amplifying a first and second signal respectively;
   a combiner circuit coupled to outputs of the first and second amplifier circuits and configured to combine power from the first and second amplifier circuits to form an output signal with an envelope amplitude influenced by a phase relation between the first and second signals;
   an input for receiving an input signal indicating a desired amplitude and phase of the output signal;
   a controllable phase shift circuit configured to adapt a phase of the first and second signals; and
   a control circuit coupled between the input and a control input of the controllable phase shift circuit and configured to control a time dependent common mode phase shift applied to both the first and second signals as a function of the desired amplitude indicated at the input.

2. A circuit according to claim 1, wherein said function is a predetermined function of the desired amplitude that has values that compensate an output signal envelope amplitude dependence of phase shifts introduced by the amplifier circuits.

3. A circuit according to claim 1, further comprising a splitter with a splitter input coupled to the input and a first splitter output and a second splitter output;
   wherein the controllable phase shift circuit comprises a first phase shifter and a second phase shifter coupled between the first and second splitter outputs and the first and second amplifier circuits respectively, the control circuit being configured to control a difference between phase shifts applied by the first and second phase shifters to adapt said phase relation between the first and second signals on which the envelope amplitude of the output signal depends.

4. A circuit according to claim 3, wherein the controllable phase shift circuit comprises a common mode phase shifter with a phase shifter input coupled to the input, the splitter being coupled between the common mode phase shifter and the first and second amplifier circuits, the control circuit having an output coupled to a phase control input of the common mode phase shifter.

5. A circuit according to claim 3, wherein the control circuit is configured to control a common mode component of the phase shifts applied by the first and second phase shifters to change to common mode component as a function of the desired amplitude indicated at the input.

6. A circuit according to claim 1, wherein the controller comprises a look-up table circuit storing values of control signals for controlling the common mode phase shift for a plurality of values of the desired amplitude.

7. A circuit according to claim 1, wherein at least one of the first and second amplifier circuits comprises a controllable preamplifier circuit and a final amplifier circuit coupled in series, the controllable preamplifier circuit having a gain control input coupled to an output of the control circuit, the control circuit being configured to control a gain of the controllable preamplifier circuit dependent on the desired amplitude indicated at the input, and to set a direction and size of the time dependent common mode phase shift to values that make the time dependent common mode phase shift compensate a phase shift resulting from control of the gain of the controllable preamplifier circuit.

8. A circuit according to claim 1, wherein the first and second amplifier circuits each comprise a controllable preamplifier circuit and a final amplifier circuit coupled in series, the controllable preamplifier circuits having gain control inputs coupled to outputs of the control circuit, the control circuit being configured to control gains of the controllable preamplifier circuits mutually differently dependent on the desired amplitude indicated at the input, keeping the output envelopes at the final amplifier circuit of the first and second amplifier circuits equal to a predetermined maximum value, at least when the desired amplitude is above a threshold value.

9. A circuit according to claim 1, further comprising a signal generator coupled to the input for providing said input signal, the signal generator being configured to perform combined data dependent modulation of both the desired amplitude and phase of the input signal in conjunction with each other.

10. A power amplification method, the method comprising:
    receiving an input signal indicating a desired amplitude and phase of an output signal;
    applying a controllable phase shift circuit configured to adapt a phase of first and second signals;
    amplifying a first signal and a second signal;
    combining power from the first and second signals to form the output signal with an envelope amplitude dependent on a phase relation between the first and second signals;
    wherein a time dependent common mode phase shift is applied to both the first and second signals, the time dependent common mode phase shift being controlled as a function of the desired amplitude indicated at the input, to common mode phase shift values that compensate envelope amplitude dependence of a common phase shift introduced by said amplifying.

11. A method according to claim 10, wherein amplification gains applied to the first and second signals are adapted mutually differently dependent on the desired amplitude, with gain values that keep the output envelopes at the final amplifier circuit of the first and second amplifier circuits equal to a predetermined maximum value, at least when the desired amplitude is above a threshold value.

* * * * *